(12) United States Patent
Vasyltsov et al.

(10) Patent No.: US 8,341,201 B2
(45) Date of Patent: Dec. 25, 2012

(54) RANDOM NUMBER GENERATOR

(75) Inventors: Ihor Vasyltsov, Suwon-si (KR); Eduard Hambardzumyan, Suwon-si (KR); Bohdan Karpinskyy, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1366 days.

(21) Appl. No.: 12/010,808

(22) Filed: Jan. 30, 2008

(65) Prior Publication Data

US 2009/0106339 A1 Apr. 23, 2009

(30) Foreign Application Priority Data

Oct. 19, 2007 (KR) .................. 10-2007-0105768

(51) Int. Cl.
*G06F 7/58* (2006.01)
(52) U.S. Cl. ....................... 708/251; 708/250
(58) Field of Classification Search .................. 708/251
See application file for complete search history.

(56) References Cited

U.S. PATENT DOCUMENTS

| 5,706,218 A | 1/1998 | Hoffman |
| 5,961,577 A | 10/1999 | Soenen et al. |
| 2002/0156819 A1* | 10/2002 | Oerlemans ................ 708/252 |
| 2004/0264233 A1* | 12/2004 | Fukushima et al. ......... 365/145 |
| 2005/0004960 A1* | 1/2005 | Hars .......................... 708/251 |
| 2006/0069706 A1 | 3/2006 | Lazich et al. |
| 2007/0296025 A1* | 12/2007 | Matsumoto et al. ......... 257/324 |

FOREIGN PATENT DOCUMENTS

JP 2005-018251 1/2005

* cited by examiner

*Primary Examiner* — Li B Zhen
*Assistant Examiner* — V Miller
(74) *Attorney, Agent, or Firm* — Harness, Dickey & Pierce, PLC

(57) ABSTRACT

Provided is a random number generator including: a clock generator outputting first and second control signals; a ring oscillator (RO) block receiving a meta stable voltage and performing an oscillation operation using the meta stable voltage in response to the first control signal; and a sampling unit sampling an output signal according to the oscillation operation in response to the second control signal.

22 Claims, 11 Drawing Sheets

RANDOM NUMBER GENERATOR

PRIORITY STATEMENT

This application claims the benefit of Korean Patent Application No. 10-2007-0105768, filed on Oct. 19, 2007, in the Korean Intellectual Property Office, the disclosure of which is incorporated herein in its entirety by reference.

BACKGROUND

1. Field

Example embodiments relate to a random number generator, and more particularly, to a random number generator capable of increasing its performance without an increase in a circuit area and/or circuit manufacturing costs.

2. Description of the Related Art

As information and communication based technologies have developed, encryption and decryption have become important as a way to protect the confidentiality of information. Random numbers are used in many applications such as the generation of secret keys for security systems. Accordingly, systems in which security is important use random number generators. Random number generators necessarily generate unpredictable random numbers.

In systems in which security is important, random numbers are not permitted to have periodicity or be regular. In more detail, security systems need to generate perfect random numbers that are unpredictable and have no periodicity. True random numbers (TRNs) are generated from physical noise sources, are unpredictable, and have no periodicity.

In order to generate TRNs, conventional random number generators have used thermal noise or shot noise as a noise source. Alternatively, conventional random number generators have generated clock signals having irregular periods using ring oscillators.

FIG. 1A is a diagram of a related art random number generator. FIG. 1B is a diagram of signals that are input into and output from the related art random number generator of FIG. 1A. The related art random number generator will now be described with reference to FIGS. 1A and 1B.

Referring to FIG. 1A, a related art random number generator 100 may comprise a signal terminal 103 that receives a signal clock S_in, a clock terminal 105 that receives a clock signal S_CLK, and a sampling block 101.

The signal clock S_in that is input into the signal terminal 103 may be a high frequency clock signal may have a regular and short period.

The clock signal S_CLK that is input into the clock terminal 105 may be a low frequency clock signal has irregular period and duty cycle. The clock signal S_CLK may have a period longer than the signal clock S_in.

The sampling block 101 may be synchronized with the clock signal S_CLK and sample the signal clock S_in in accordance with a rising edge of the clock signal S_CLK.

Referring to FIG. 1B, the signal clock S_in 110 may be a signal having regular periods each having the same duty cycle. The clock signal S_CLK 115 may be a signal having irregular periods, some or all having a different duty cycle.

The sampling block 101 may perform a sampling operation and output a random number signal S_RN 120.

The random number signal S_RN 120 may sample a value of the signal clock S_in 110 every rising edge of the clock signal S_CLK 115 and generate the random number signal S_RN. Therefore, the sampling block 101 may sample the value of the signal clock S_in at a point a, outputs the value "1", and generate the value "0" at a point b, the value "0" at a point c, the value "0" at a point d, and the value "1" at a point f.

As described above, the clock signal S_CLK must have irregular period and duty cycle. A related art random number generator may use a ring oscillator (RO) in order to generate the clock signal S_CLK.

The RO performs an oscillation operation and outputs an oscillation signal having a jitter in order to produce an irregular period.

The oscillation signal that is output from the RO will now be described with reference to FIG. 2.

FIG. 2 is a waveform diagram of the generation of an oscillation signal. Referring to FIG. 2, an RO (not shown) performs an inversion operation for inverting a logic level at an initial duration <X>, so that a sine waveform signal having a predetermined or given period Tosc is output. A signal 210 that is output at the duration <X> may be a stabilized oscillation signal.

The RO continuously performs an oscillation operation. After a period of time of a duration <Y> further passes, the RO outputs an oscillation signal having jitter. Jitter is a shake of a signal on a temporal axis (a coordinate at an axis x) due to accumulated noise.

Therefore, a curve signal may shake and its real value lies between 215 and 220 at a duration <Z>. So, at the duration <Z>, a period and its duty cycle are irregular.

The related art random number generator must perform a sampling operation according to a signal having an irregular signal in order to generate a true random number. The signal having the irregular signal must be generated after passing the durations <X> and <Y>. Therefore, the related art random number generator cannot output a random number immediately after the RO starts its operation but after at least a period of time of the durations <X> and <Y> elapses.

The related art random number generator may output random number data after an oscillation signal having the jitter is generated, which reduces throughput.

The related art random number generator additionally may contain a circuit for generating and providing noise in order to artificially provide physical noise and generate the oscillation signal having jitter. This circuit may increase an area and/or manufacturing cost of the conventional random number generator.

SUMMARY

Example embodiments provide a random number generator capable of increasing throughput without an increase in circuit area or manufacturing cost.

Example embodiments provide a random number generator that performs an oscillation operation using a meta stable voltage.

According to example embodiments, there is provided a random number generator comprising: a clock generator outputting first and second control signals; a ring oscillator (RO) block receiving a meta stable voltage and/or performing an oscillation operation using the meta stable voltage in response to the first control signal; and a sampling unit sampling an output signal according to the oscillation operation in response to the second control signal.

The RO block may generate or receive the meta stable voltage in response to one logic level of the first control signals and perform an RO operation using the meta stable voltage in response to another logic level of the first control signal.

The meta stable voltage may have an intermediate (for example, close to mean) value between a voltage value of a logic low signal and a voltage value of a logic high signal.

According to example embodiments, there is provided a random number generator comprising: a clock generator outputting first and second control signals; an RO block receiving a meta stable voltage in response to one logic level of the first control signals and/or for performing an RO operation using the meta stable voltage in response to another logic level of the first control signal; and a sampling unit sampling an output signal according to the oscillation operation in response to the second control signal.

The RO block may comprise: a variable delay unit varying a delay amount in response to the first control signal; and an inverting element connected in series with an output end of the variable delay unit and comprising one or odd number of inverting elements performing the RO operation, wherein an output end of the inverting element and an input end of the variable delay unit are connected via a feedback path.

According to example embodiments, a physical or intrinsic noise, for example, noise generated by heat, by one or more components of a random number generator may be used to introduce non-periodicity, irregularity, and/or and unpredictability.

BRIEF DESCRIPTION OF THE DRAWINGS

The above and other features and advantages of example embodiments will become more apparent by describing them in detail with reference to the attached drawings in which.

DETAILED DESCRIPTION OF EXAMPLE EMBODIMENTS

Figure 1A:
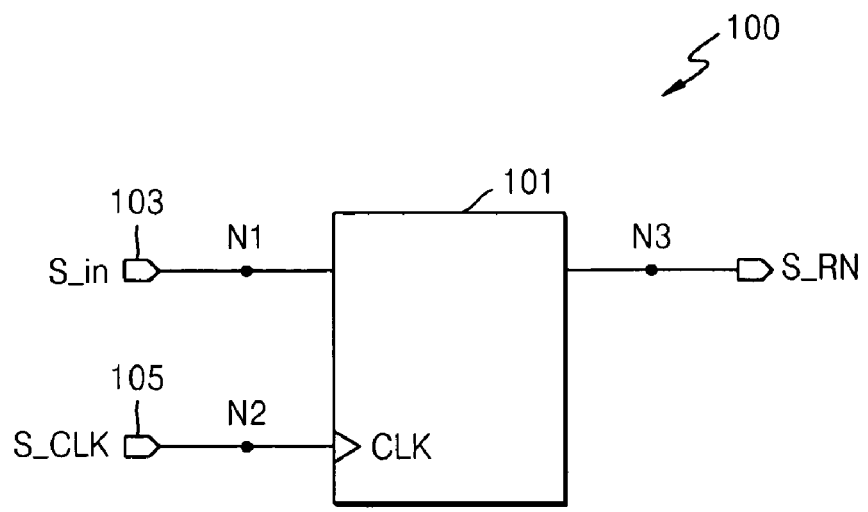
FIG. 1A is a diagram of a related art random number generator.
Figure 1B:
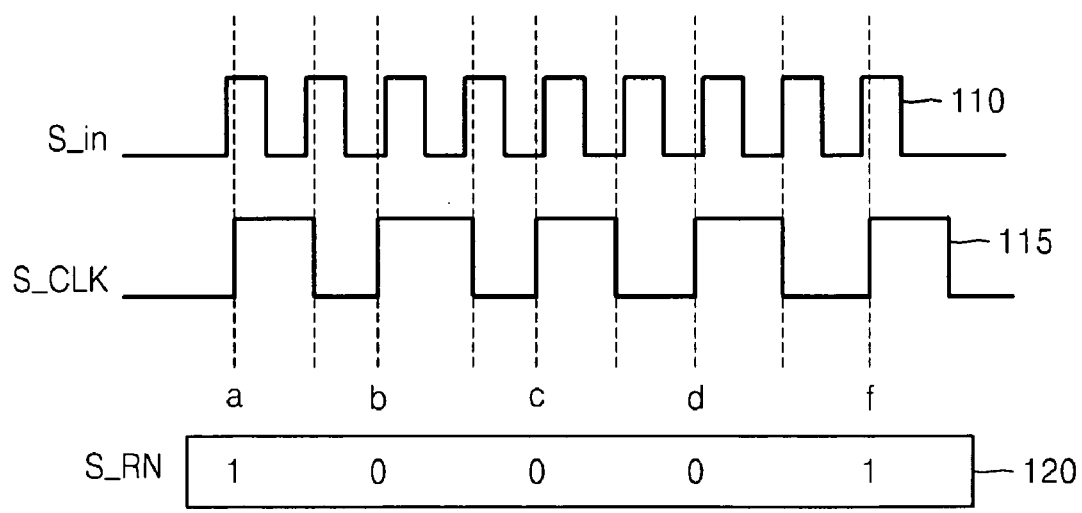
FIG. 1B is a diagram of signals that are input into and output from the related art random number generator of FIG. 1A.

Example embodiments will be more clearly understood from the detailed description taken in conjunction with the accompanying drawings.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

Now, in order to more specifically describe example embodiments, various embodiments will be described in detail with reference to the attached drawings. However, the present invention is not limited to example embodiments, but may be embodied in various forms. In the figures, if a layer is formed on another layer or a substrate, it means that the layer is directly formed on another layer or a substrate, or that a third layer is interposed therebetween. In the following description, the same reference numerals denote the same elements.

Although example embodiments have been disclosed for illustrative purposes, those skilled in the art will appreciate that various modifications, additions and substitutions are possible, without departing from the scope and spirit of the invention as disclosed in the accompanying claims.

Example embodiments will be described in detail with reference to the attached drawings. Throughout the drawings, like reference numerals refer to like elements.

Figure 3A:
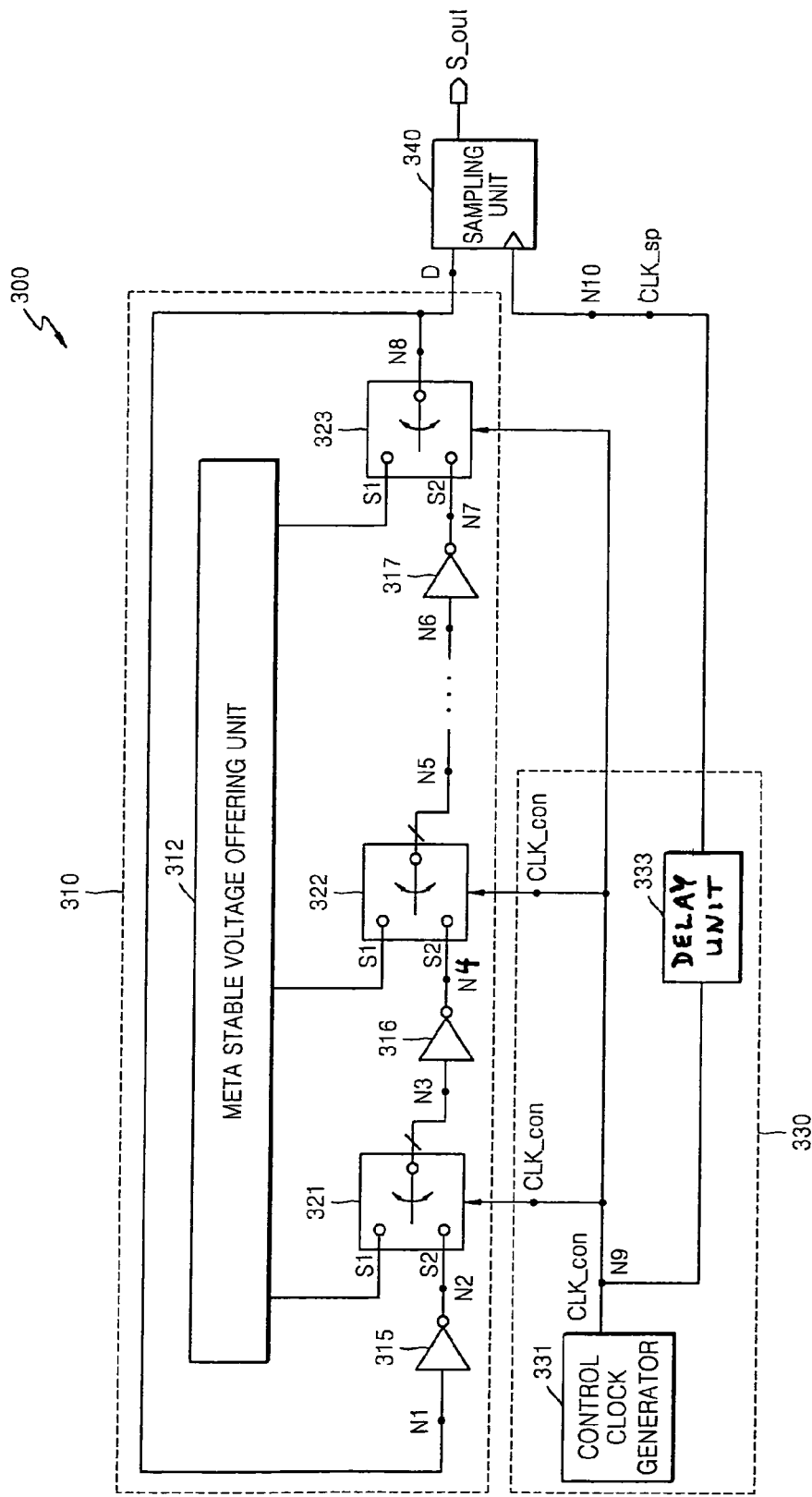
FIG. 3A is a diagram of a random number generator according to example embodiments.

FIG. 3A is a diagram of a random number generator 300 according to example embodiments. Referring to FIG. 3A, the random number generator 300 may comprise a ring oscillator (RO) block 310, a clock generator 330, and/or a sampling unit 340.

The RO block 310 may comprise a meta stable voltage offering unit 312, an odd number of inverting elements 315, 316, and 317, and/or a plurality of switching units 321, 322, and 323.

The odd number (including one) of inverting elements may be inverters 315, 316, and 317. Hereinafter, inverting elements are the inverters 315, 316, and 317.

Alternatively, the inverting elements may be NAND gates, NOR gates, or XNOR gates, instead of inverters. The input part of NAND gates, NOR gates, or XNOR gates may receive a common input signal.

The meta stable voltage offering unit 312 may generate and output a meta stable voltage. The meta stable voltage is a voltage having an intermediate value of a logic low voltage value and a logic high voltage value. For example, a CMOS outputting 0V and 2V as logic low and logic high may use 0.753V as an example of a meta stable voltage.

The odd number of inverters 315, 316, and 317 and the plurality of switching units 321, 322, and 323 having the same number as the inverters (for example), may alternatively be connected in series with each other.

Each of the plurality of switching units 321, 322, and 323 may perform a switching operation in response to a first control signal CLK_con. For example, each of the plurality of switching units 321, 322, and 323 may connect a switching terminal to a terminal S1 in response to one logic level (hereinafter referred to as a first logic level) of the first control signal CLK_con, and the switching terminal to a terminal S2 in response to another logic level (hereinafter referred to as a second logic level) of the first control signal CLK_con. A representative switching unit may be a multiplexer MUX or any other element capable of performing a switching operation.

The clock generator 330 may comprise a control clock generator 331 and a delay unit 333. The control clock generator 331 may generate and output the first control signal CLK_con.

The delay unit 333 may receive the first control signal CLK_con, delay the received first control signal CLK_con for a predetermined or desired period of time, and output a second control signal CLK_sp. The first control signal CLK_con and the second control signal CLK_sp may be clock signals.

The sampling unit 340 may receive the second control signal CLK_sp as a clock terminal and an output signal D of the RO block 310 as a data input terminal. The sampling unit 340 may sample the output signal D that is synchronized with the second control signal CLK_sp. The sampling unit 340 may use a flip-flop or any other elements capable of performing a sampling operation. The sampling operation of the sampling unit 340 may output random number data S_out.

Figure 3B:
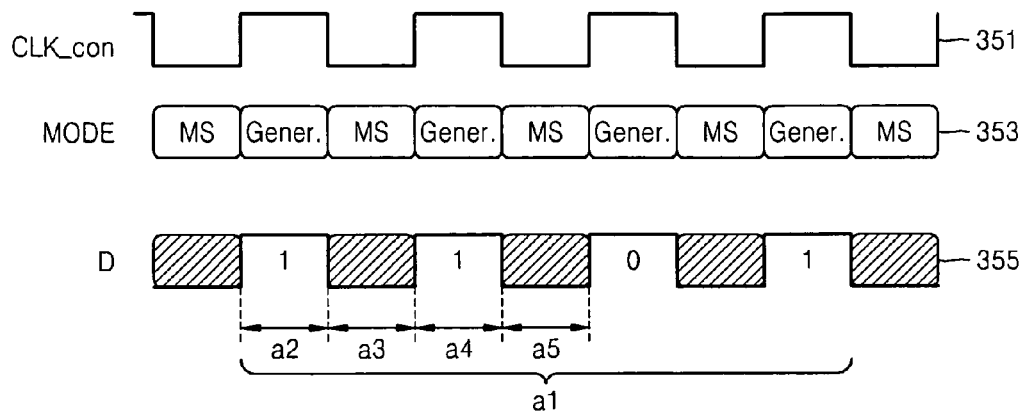
FIG. 3B is an example diagram of a signal that is input into and output from the random number generator of FIG. 3A.
Figure 3C:
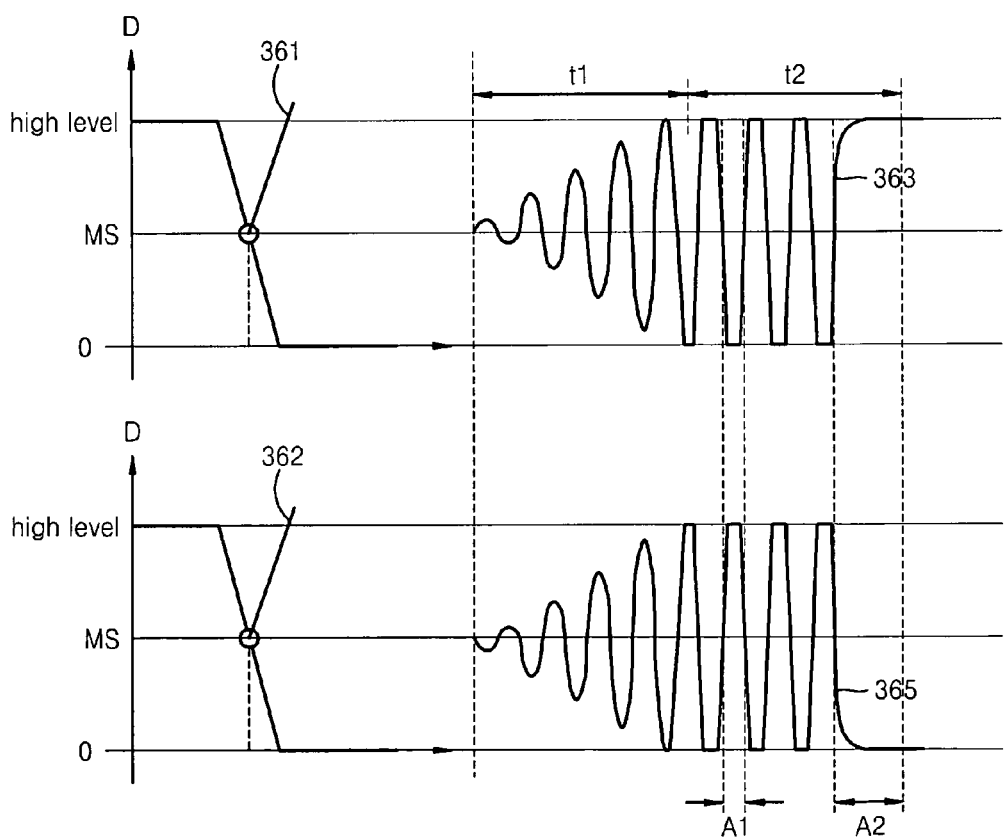
FIG. 3C is an example waveform diagram for explaining the generation of a signal oscillated in the random number generator of FIG. 3A.
Figure 3D:
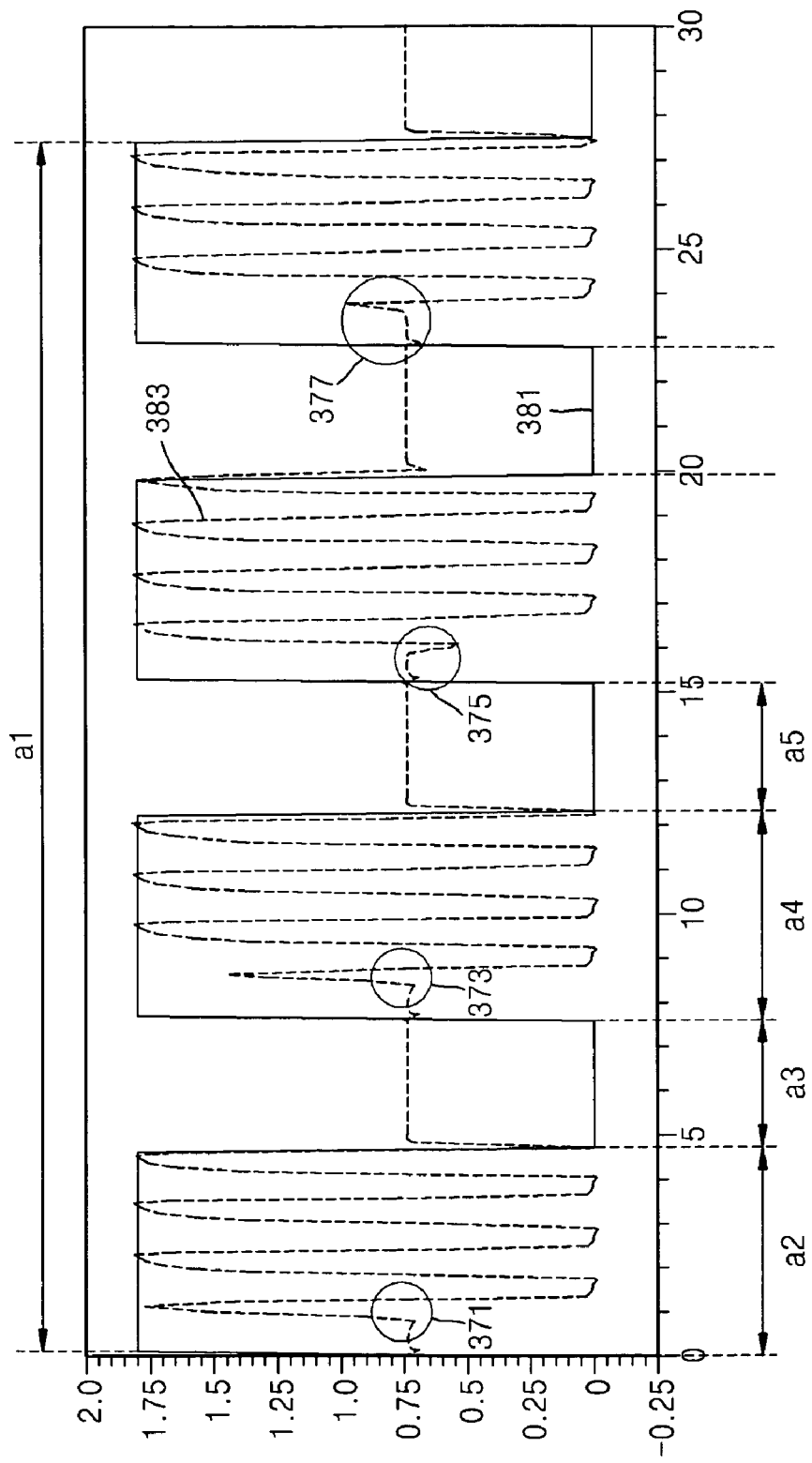
FIG. 3D is an example waveform diagram for explaining the operation of the random number generator of FIG. 3A.

FIG. 3B is an example diagram of a signal that is input into and output from the random number generator 300 of FIG. 3A. FIG. 3C is an example waveform diagram for explaining the generation of a signal oscillated in the random number generator 300 of FIG. 3A. FIG. 3D is an example waveform diagram for explaining the operation of the random number generator 300 of FIG. 3A.

The operation of the random number generator 300 of FIG. 3A will now be described with reference to FIGS. 3B through 3D.

Referring to FIG. 3A, the random number generator 300 may output the first control signal CLK_con that is a clock signal having a predetermined or desired period.

The operation of the random number generator 300 of example embodiments may be divided into two operation modes. In a first operation mode, the first control signal CLK_con has a first logic level (for example, a logic low level). In a second operation mode, the first control signal CLK_con has a second logic level (for example, a logic high level).

In the first operation mode indicated as "MS" of a diagram 353, the switching terminals of the switching units 321, 322, and 323 may be connected to the terminal S1, so that each of the inverters 315, 316, and 317 receives the meta stable voltage that is output from the meta stable voltage offering unit 312.

In the second operation mode indicated as "Gener" of the diagram 353, the switching terminals of the switching units 321, 322, and 323 may be connected to the terminal S2, so that the RO block 310 forms an inverter chain and performs an RO operation.

Referring to FIG. 3B, the first and second operation modes may be alternately performed. After the first operation mode is performed, the meta stable voltage may be applied to an input end of each of the inverters 315, 316, and 317. Thereafter, the second operation mode is performed, so that the RO block 310 formed as the inverter chain may perform the RO operation using the meta stable voltage. In the second operation mode, data D generated by the RO operation may be output. The oscillation operation is an operation of a circuit that repeatedly varies between high and low logic levels.

Referring to FIG. 3C, the RO block 310 may generate and output a signal. In the first operation mode in which the first control signal CLK_con has the first logic level, meta stable voltages MS are applied to the input end of each of the inverters 315, 316, and 317. The meta stable voltages MS are points 361 and 362.

In the second operation mode in which the first control signal CLK_con has the second logic level, the switching terminals are connected to the terminal S2 to start the RO operation. Signals that are output by the oscillation operation are curves 363 and 365.

Inverters (for example, 315) may generate heat due to circuit operation. The heat may be a source of an irreversible noise. For example, the inverter 315 itself has a thermal noise. Inverting elements other than the inverter 315 generate some heat by their own circuit operations. For example, a circuit element included in the RO block 310 has a thermal noise.

The meta stable voltages MS 361 and 362 toggle up or down due to the thermal noise of the inverting elements. Because irregular thermal noise is applied when the RO block 310 outputs data D, it is not informed of whether the meta stable voltages MS 361 and 362 starts toggling up or down.

The curve 363 indicating a signal output from the RO block 310 starts toggling up due to the thermal noise.

The curve 365 indicating another signal output from the RO block 310 starts toggling down at first due to the thermal noise.

A sampling value changes according to the direction the curves 363 and 365 start toggling. For example, at a section A1, a logic low value is sampled in the curve 363, whereas a logic high value is sampled in the curve 365. At a section A2, a logic high value is sampled in the curve 363, whereas a logic low value is sampled in the curve 365. For example, the random number generator 300 has non-periodicity and unpredictability.

The sampling unit 340 may perform the sampling operation at a section t2 in which a stable oscillation is carried out.

At a section t1, a transition process is carried out. For example, if the oscillation starts, amplitude increases and converges to a predetermined or given value. The section t1 between the start and end of the oscillation is referred to as a transition process section. A period of time taken for the transition process section t1 has a very small value (generally, a nano sec. value) within several periods generally.

Because the sampling operation of the sampling unit 340 is carried out after the transition process section t1 elapses, the second control signal CLK_sp that is a sampling clock is a phase delayed signal by a predetermined or given delay amount compared to the first control signal CLK_con. The predetermined or given delay amount may be determined according to the period of time taken for the transition process section t1. The time taken for the transition process section t1 is a value that may be changed according to maximum voltage amplitude, or specification of inverting elements (for example, inverters). Therefore, the predetermined or given delay amount may be set to a different value, depending on the situation.

Figure 2:
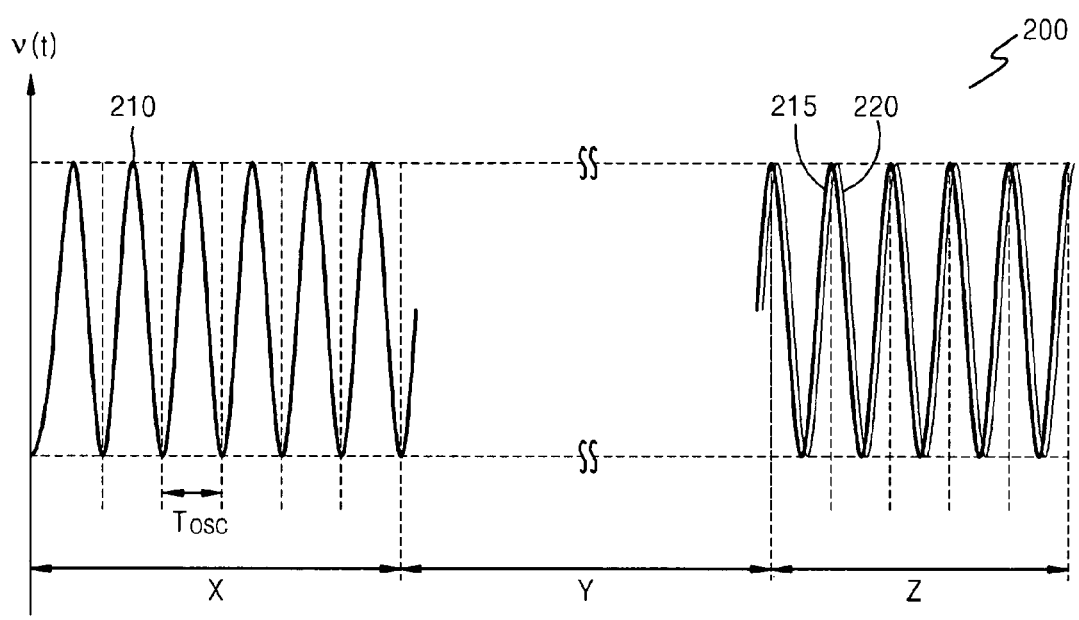
FIG. 2 is a waveform diagram of the generation of an oscillation signal.

The random number generator 300 may perform the RO operation after applying the meta stable voltage (the first operation mode), and has irregularity and non-periodicity. Therefore, the random number generator 300 may output the random number data D having irregularity and non-periodicity without waiting for the generation of an oscillation signal having a jitter. For example, in comparison with the random number generator 300 and the conventional random number generator, the random number generator 300 does not need to wait until time taken for the sections <X> and <Y> shown in FIG. 2, which increases throughput per hour compared to the conventional random number generator.

Further, the random number generator 300 does not need additional circuits for generating and providing a separate noise source or increasing throughput per hour, thereby reducing a circuit area and circuit manufacturing cost.

When the oscillation signal having the jitter (between 215 and 220 of FIG. 2) is similarly synchronized with a sampling clock signal (corresponding to the second clock signal of example embodiments), it is difficult for the related art random number generator to generate a true random number having non-periodicity, and security of a system is suspect. However, the random number generator 300 may perform an oscillation operation by applying a thermal noise of the circuit to the metal stable voltage signal, thereby generating a true random number having regular non-periodicity and irregularity. Therefore, the random number generator 300 may maintain the security of the system compared to the related art random number generator.

Referring to FIG. 3D illustrating the operation of the RO block 310, an axis y is an output end signal D of the RO block 310, and is a voltage value. An axis x is a period of time elapsed. A signal 381 is a waveform of the first control signal to divide the first and second operation modes.

At sections <a2> and <a4>, the second operation mode is carried out. At sections <a3> and <a5>, the first operation mode is carried out. At the section <a2>, toggling starts up (toward a logic low level) at a duration 371. The first operation mode is carried out at the section <a3>. A voltage level is the meta stable voltage level. Toggling starts up at a duration 373. Toggling having an amplitude value that cannot be recognized as a signal is disregarded. At a duration 375, toggling starts down. Toggling starts up at a duration 377.

As described above, because a different thermal noise is applied to the RO block 310, the RO block 310 has an irregular toggling direction. Therefore, the data D that is output in the table 355 of FIG. 3B includes 1, 1, 0, and 1 at random.

Figure 4:
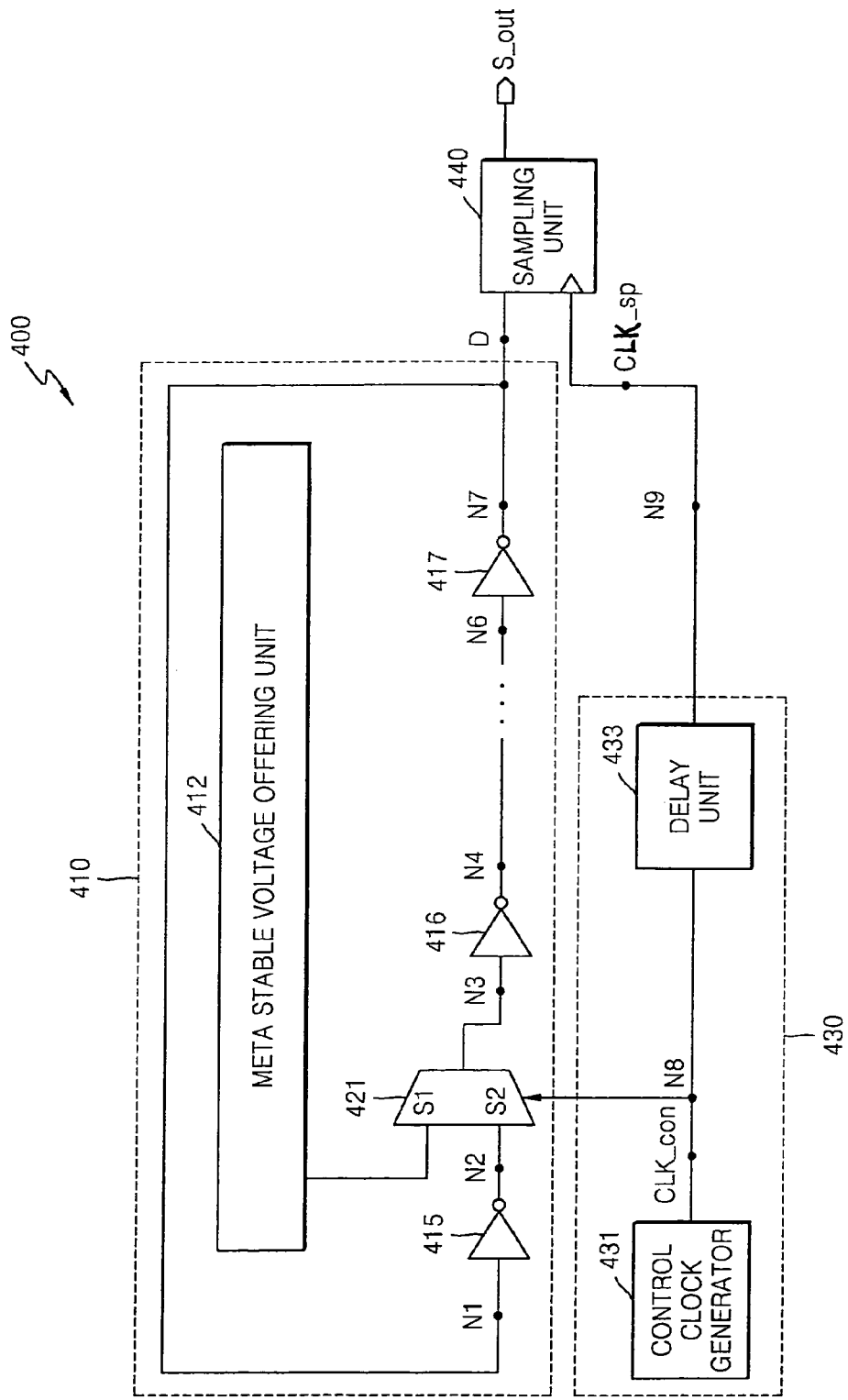
FIG. 4 is a diagram of a random number generator according to example embodiments.

FIG. 4 is a diagram of a random number generator 400 according to example embodiments. A switching unit is used as a MUX in FIGS. 4, 5, and 6.

Referring to FIG. 4, the random number generator 400 may comprise a single switching unit 421 compared to the random number generator 300 of FIG. 3A. A control clock generator 431 may output a first control signal CLK_con that is applied to the switching unit 431 only.

In example embodiments, the switching unit 421 is connected in series with an output end of a first arranged inverter 415. However, the switching unit 421 may be connected in series with one of output ends of a plurality of inverters.

The operation and configuration of the random number generator 400 are the same as those of the random number generator 300 of FIG. 3A.

Figure 5:
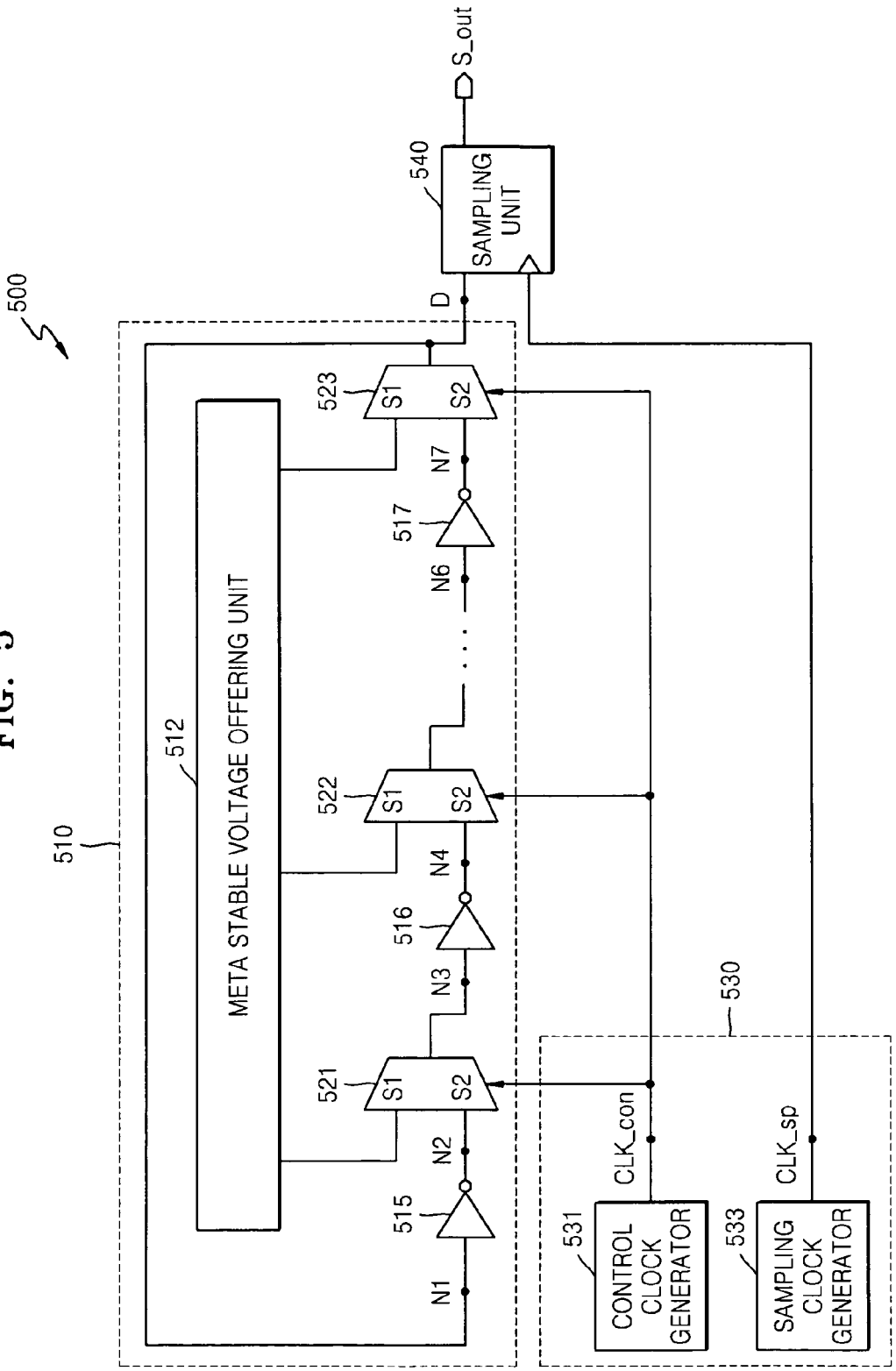
FIG. 5 is a diagram of a random number generator according to example embodiments.

FIG. 5 is a diagram of a random number generator 500 according to example embodiments. Referring to FIG. 5, the random number generator 500 is different from the random number generator 300 of FIG. 3A in the configuration of a clock generator 530.

The clock generator 530 of the random number generator 500 may comprise a control clock generator 531 and a sampling clock generator 533. The control clock generator 531 may generate and output a first control signal CLK_con. The sampling clock generator 533 may output a second control signal CLK_sp.

The operation and configuration of the random number generator 500 are the same as those of the random number generator 300 of FIG. 3A.

Figure 6:
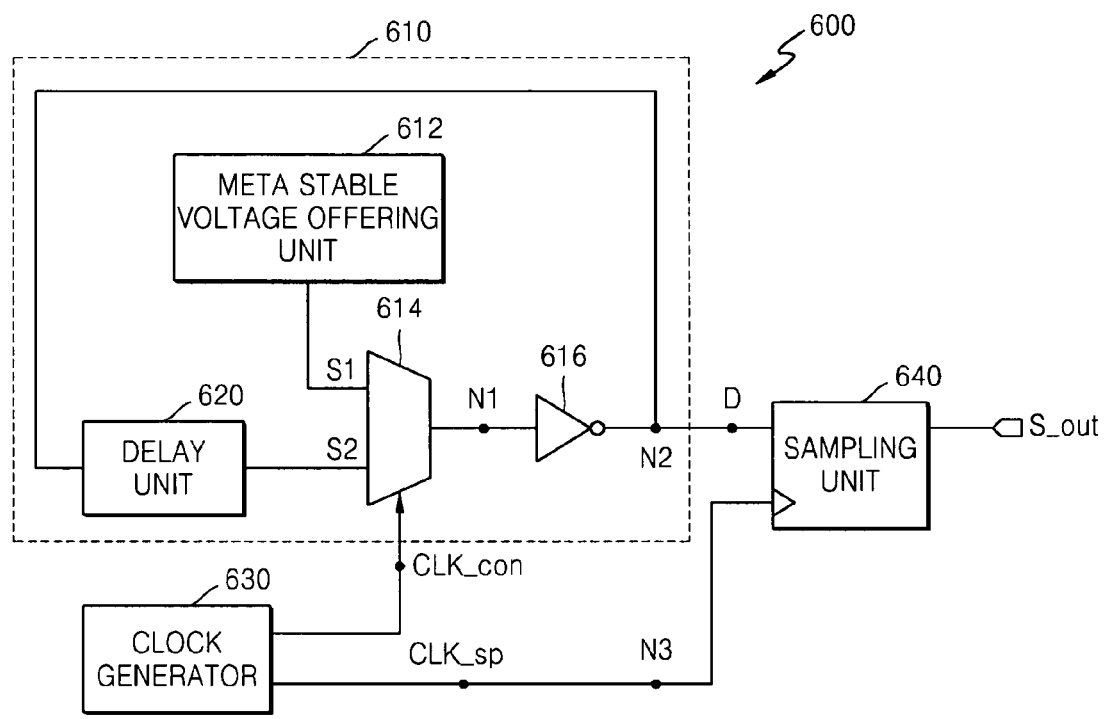
FIG. 6 is a diagram of a random number generator according to example embodiments.

FIG. 6 is a diagram of a random number generator 600 according to example embodiments. Referring to FIG. 6, the random number generator 600 may comprise an RO block 610, a clock signal generator 630, and/or a sampling unit 640.

The RO block 610 may comprise a delay unit 620, a switching unit 614, a meta stable voltage offering unit 612, and/or a single inverting element 616. In example embodiments, the switching unit 614 is a MUX, and the inverting element 616 is an inverter. A logic element may be used as the switching unit 614 and the inverting element 616 as shown in FIG. 3A.

The delay unit 620 may receive a feedback signal D that is output from the RO block 610. The delay unit 620 may have a predetermined or given delay amount, delay an input signal by the predetermined or given delay amount, and output the delayed signal to a terminal S2 that is one input terminal of the switching unit 614.

The switching unit 614 may connect a first node N1 to one of terminals S1 and S2 in response to the first control signal CLK_con.

The switching unit 614, the meta stable voltage offering unit 612, and the single inverting element 616 of the RO block 610 may correspond to the switching unit 321, the meta stable voltage offering unit 312, and the single inverting element 315 of FIG. 3A, respectively, and each corresponding constituent may perform the same operation.

The random number generator 600 may have an odd number of inverting elements 616 that are connected in series with each other as shown in FIG. 3A.

The clock signal generator 630 may correspond to the clock generator 330 of FIG. 3A. Therefore, the clock signal generator 630 may comprise a control clock generator (not shown) (corresponding to the control clock generator 331 of FIG. 3A) and a delay unit (not shown) (corresponding to the delay unit 333 of FIG. 3A).

The clock signal generator 630 may generate and output a first control signal CLK_con and a second control signal CLK_sp.

With regard to the operation of the random number generator 600 shown in FIG. 6, the clock signal generator 630 may output the first control signal CLK_con to a first logic level (that is a logic level for entering the RO block 610 into an MS mode). A switching terminal may connect the first node N1 and a terminal S1, so that a meta stable voltage is supplied to an input terminal of the inverter 616.

The clock signal generator 630 may output the first control signal CLK_con to a second logic level (that is a logic level for entering the RO block 610 into a Gener. operation mode). The switching terminal may connect the first node N1 to a terminal S2. Therefore, the inverter 616 and the delay unit 620 may be connected in series with each other and generate a single feedback loop. The feedback loop performs an RO operation using the meta stable voltage applied to the first node N1.

The operation and configuration of the sampling unit 640 are the same as those of the sampling unit 340 of FIG. 3A. The second control signal CLK_sp may be the same as that of FIG. 3A.

Figure 7A:
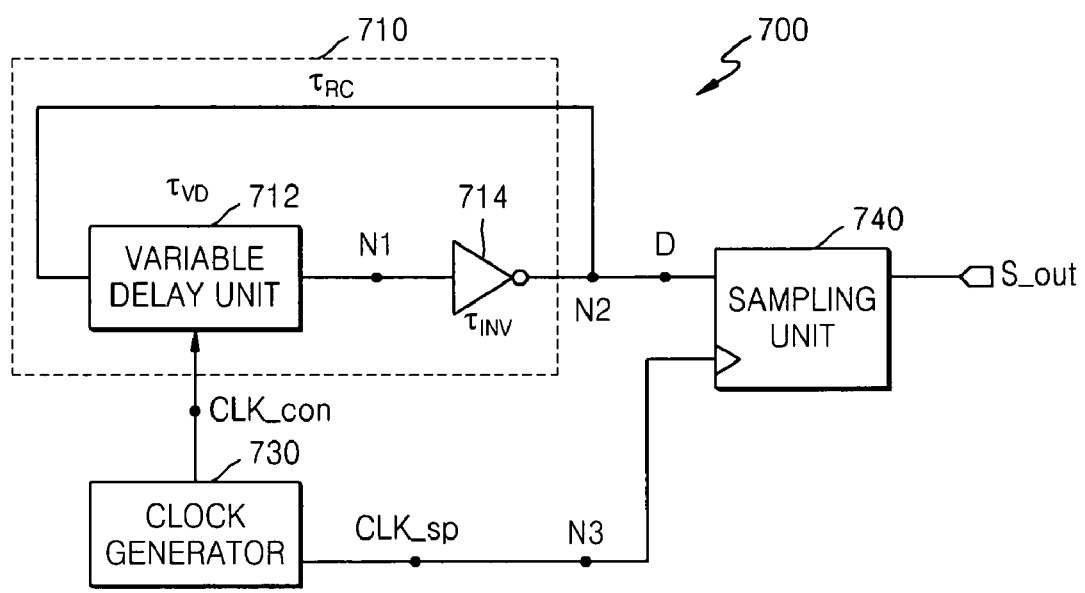
FIG. 7A is a diagram of a random number generator according to example embodiments.
Figure 7B:
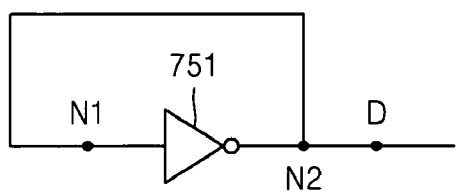
FIG. 7B is an example diagram of an operation of the random number generator of FIG. 7A.

FIG. 7A is a diagram of a random number generator 700 according to example embodiments. FIG. 7B is a diagram of an operation of the random number generator 700 of FIG. 7A.

The operation and configuration of the random number generator 700 will now be described with reference to FIGS. 7A and 7B.

Referring to FIG. 7A, the random number generator 700 may comprise an RO block 710, a clock signal generator 730, and/or a sampling unit 740.

The RO block 710 may comprise a variable delay unit 712 and an inverting element 714. The inverting element 714 may be singular as shown or an even number of inverting elements 714 may be connected in series with each other. In example embodiments, the inverting element 714 is an inverter.

The configuration and operation of the inverting element 714, the clock generator 730, and the sampling unit 740 are the same as those of the inverting element 315, the clock generator 330 (or the clock generator 630 of FIG. 6), and the sampling unit 340 of FIG. 3A, respectively.

The variable delay unit 712 may vary a delay amount in response to a first control signal CLK_con. The varied delay amount will now be described.

The delay amount of the variable delay unit 712 is $\tau_{VD}$. A delay amount of the inverting element 714 is $\tau_{INV}$. A parasitic RC (resistance and capacitance) characteristics of a feedback loop that connects an output end of the RO block 710 and an input end of the variable delay unit 712 is $\tau_{RC}$ since all conductors include a resistance and capacitance of a metal line.

The delay amount of the inverter may change according to a type or specifications of the inverter. Therefore, the delay amount of the inverter may not be a variable value according to the setting of a control signal but be a fixed value. The RC characteristics of the feedback loop is determined according to capacitance and inductance, length, and/or diameter of a metal conductor. Further, the RC characteristics of the feedback loop may not be a variable value according to the setting of a control signal but be a fixed value.

The operation mode of the random number generator 700 may be divided into a first operation mode (an MS operation mode) and a second operation mode (a Gener. operation mode) as shown in FIG. 3A.

A first control signal CLK_con generated by the clock generator 730 may have a first logic level (for example, logic low) and a second logic level (for example, logic high).

When the first control signal CLK_con has the first logic level, the condition of Inequality 1 below is satisfied. If the first control signal CLK_con is applied to the RO block 710 as the first logic level, the variable delay unit 712 may set the variable delay amount as a value much smaller than the delay value caused by parasitic RC characteristics of the feedback loop.

$$(\tau_{VD} + \tau_{INV}) \ll \tau_{RC} \qquad 1)$$

For example, when the sum of the delay amounts of the variable delay unit 712 and the inverter 714 is small compared to those of the feedback loop, the RO block 710 may be operated at the first operation mode.

As described above, a delay amount of the inverter and a delay amount of the feedback loop have a fixed value per device. Therefore, in order to satisfy Inequality 1 above, the delay amount of the variable delay unit 712 must have a smaller value.

The operation of the RO block 710 in the first operation mode to which Inequality 1 is applied is described with reference to FIG. 7B.

Referring to FIG. 7B, as described above, the delay amount of the variable delay unit 712 may have a value close to 0. Therefore, the variable delay unit 712 is assumed to no longer exist.

An inverter 751 that is a simple logic element has a small delay amount and usually delay amount caused by parasitic RC characteristics of the feedback loop is bigger. Therefore, the Inequality 1 is satisfied and after a while, any signal converges to some stable level with a meta stable voltage value.

According to the first operation mode, the meta stable voltage value is applied to the first node N1.

When the first control signal CLK_con has the second logic level, Inequality 2 is established. If the first control signal CLK_con is applied to the RO block 710 as the second logic level, the variable delay unit 712 may set the variable delay amount as a much larger value than the delay value caused by parasitic RC characteristics of the feedback loop.

$$(\tau_{VD} + \tau_{INV}) \gg \tau_{RC} \qquad 2)$$

For example, when the sum of the delay amounts of the variable delay unit 712 and the inverter 714 is large compared to those of the feedback loop, the RO block 710 is operated at the second operation mode.

As described above, a resistance amount of the inverter and a resistance amount of the feedback loop may have a fixed value per device. Therefore, in order to satisfy Inequality 2 above, the delay amount of the variable delay unit 712 may be set to be larger than the resistor of the feedback loop. The configuration and the operation of the random number generator 700 may correspond to those of the random number generator 600 of FIG. 6 in the second operation mode. For example, the random number generator 700 may perform an oscillation operation using the meta stable voltage applied to the first node N1 at the first operation mode.

Figure 8:
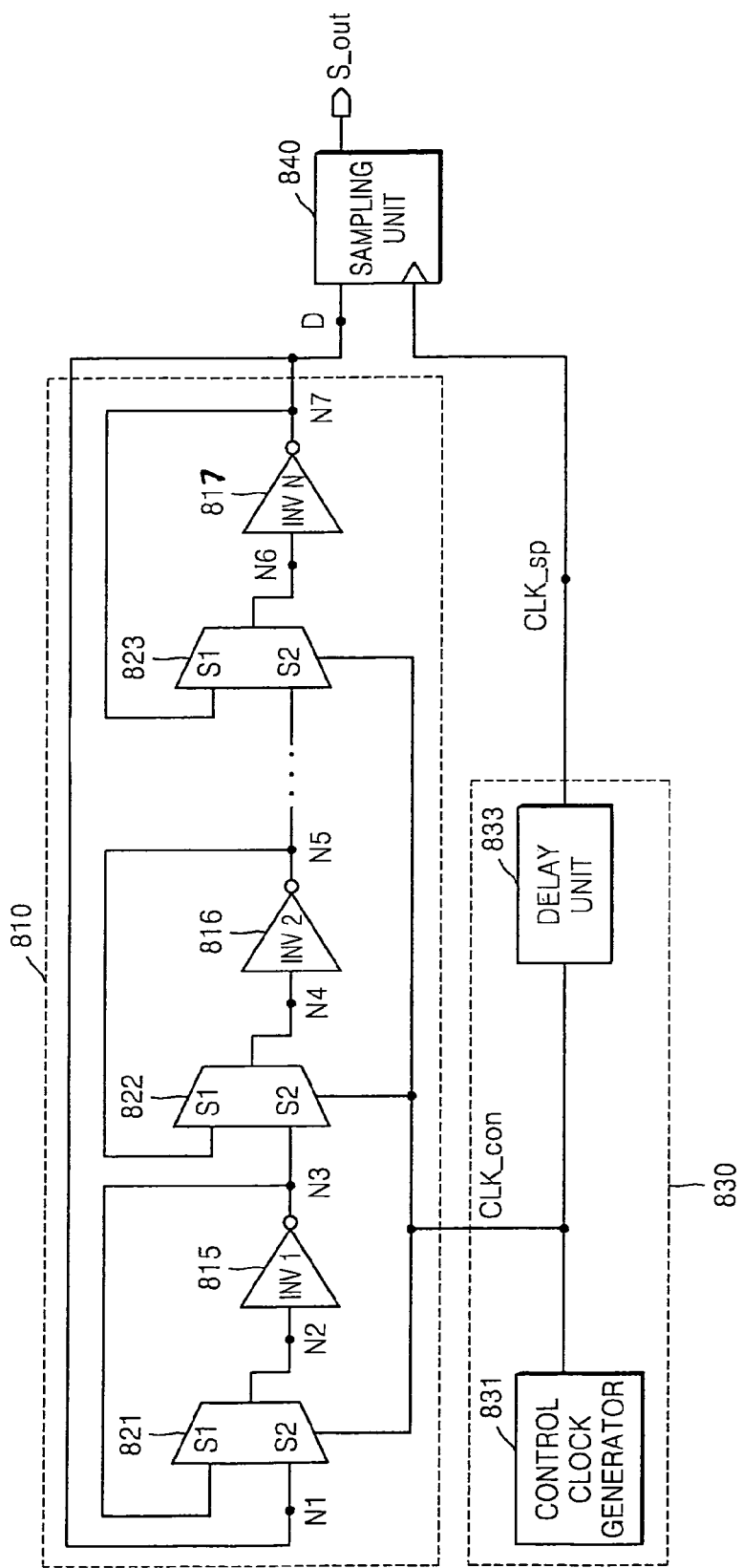
FIG. 8 is a diagram of a random number generator according to example embodiments.

FIG. 8 is a diagram of a random number generator according to example embodiments. FIG. 8 is a diagram of a random number generator 800 according to example embodiments. Referring to FIG. 8, the random number generator 800 may comprise an RO block 810, a clock signal generator 830, and/or a sampling unit 840. The RO block 810 may comprise inverting elements 815, 816, and 817, and/or a plurality of switching units 821, 822, and 823.

The clock generator 830 may comprise a control clock generator 831 and a delay unit 833. The control clock generator 831 may generate and output the first control signal CLK_con.

The delay unit 833 may receive the first control signal CLK_con, delay the received first control signal CLK_con for a predetermined or desired period of time, and output a second control signal CLK_sp. The first control signal CLK_con and the second control signal CLK_sp may be clock signals.

Referring to FIG. 8, a MUX may be used as a switching unit and an inverter may be used as an inverting element.

A first input end S1 of the MUX (for example, 821) receives an output signal of the inverter 815 that is serially connected to an output end of the MUX 821. For example, the serially connected MUX 821 and the inverter 815 are connected via a feedback loop. If the terminal S1 of the MUX 821 is connected to a MUX output terminal, the inverter 815 has the same shape as the inverter 751 shown in FIG. 7B.

Therefore, as described with reference to FIG. 7B, if the terminal S1 of the MUX 821 is connected to the MUX output terminal, a meta stable voltage can be applied to the inverter 815. Thus, the inverter 815 may perform the same operation as the RO 300 shown in FIG. 3A without an additional meta stable voltage offering unit.

Figure 9:
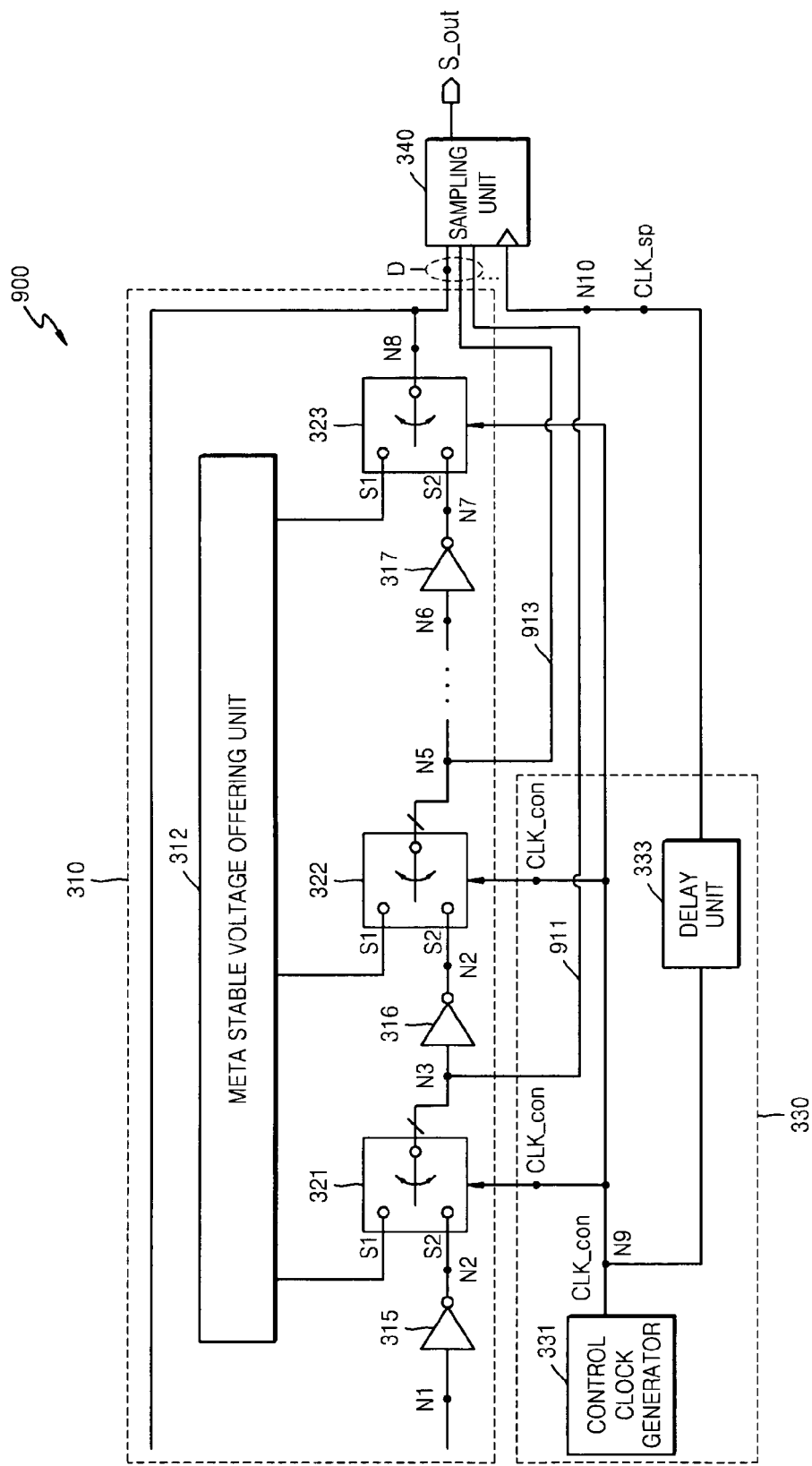
FIG. 9 is a diagram of a random number generator according to example embodiments.

FIG. 9 is a diagram of a random number generator 900 according to example embodiments. Referring to FIG. 9, the random number generator 900 may comprise switching units 321, 322, and 323 having each output end is connected to an input end D of the sampling unit 340. For example, the output end of the switching unit 321 may be connected to the input end of the sampling unit 340 via a signal line 911, and the output end of the switching unit 323 may be connected to the input end of the sampling unit 340 via a signal line 913.

The sampling unit 340 may select any one of output signals of the plurality of switching units 321, 322, and 323 and sample the selected output signal in response to the control signal CLK_con that is output from the control clock generating unit 331.

The configuration and operation of the random number generator 900 are the same as the random number generator shown in FIG. 3A and thus the detailed description thereof is not repeated.

The random number generator of example embodiments may perform an oscillation operation using a meta stable voltage, thereby reducing time taken to perform an oscillation operation without an increase in a circuit area and/or manufacturing cost. Further, the random number generator of example embodiments may reduce time taken to generate a random number, thereby increasing throughput.

While example embodiments have been particularly shown and described, it will be understood by those of ordinary skill in the art that various changes in form and details may be made therein without departing from the spirit and scope of the invention as defined by the appended claims. Example embodiments should be considered in a descriptive sense only and not for purposes of limitation. Therefore, the scope of the invention is defined not by the detailed description but by the appended claims.

What is claimed is:

1. A random number generator, comprising:
a clock generator outputting first and second control signals;
a ring oscillator (RO) block generating a meta stable voltage and performing an oscillation operation using the meta stable voltage in response to the first control signal; and
a sampling unit sampling an output signal according to the oscillation operation in response to the second control signal;
wherein the RO block generates the meta stable voltage in response to one logic level of the first control signal and performs an RO operation using the meta stable voltage in response to another logic level of the first control signal, and
wherein a first random number is generated based on the meta stable voltage, followed by generating a second random number based on the RO operation, such that random numbers are generated without waiting for generation of an oscillation signal having jitter.

2. The random number generator of claim 1, wherein the meta stable voltage has an intermediate value between a voltage value of a logic low signal and a voltage value of a logic high signal.

3. The random number generator of claim 1, wherein the first and second control signals are clock signals having a phase difference.

4. The random number generator of claim 1, wherein the RO block comprises:
an odd number of inverting elements; and
a plurality of switching units;
wherein each of the switching units is connected in series with an output end of a respective one of the inverting elements.

5. The random number generator of claim 4, wherein the RO block further comprises:
a meta stable voltage offering unit connected to an input end of each of the switching units;
wherein the meta stable voltage offering unit generates and outputs the meta stable voltage.

6. The random number generator of claim 3, wherein the clock generator comprises:
a control clock generator providing the first control signal to the RO block; and
a delay unit receiving the first control signal, delaying the received first control signal by the phase difference, and outputting the second control signal to the sampling unit.

7. The random number generator of claim 6, wherein the delay unit comprises one or more inverters.

8. The random number generator of claim 4, wherein the inverting elements are inverters.

9. The random number generator of claim 4, wherein the inverting elements include one or more NAND gates, one or more NOR gates, or one or more XNOR gates.

10. The random number generator of claim 4, wherein each of the switching units comprises a multiplexer.

11. The random number generator of claim 1, wherein the RO block comprises:
an odd number of inverting elements; and
a switching unit connected to an output end of one of the inverting elements;
wherein the inverting elements and the switching unit are connected in series with each other.

12. The random number generator of claim 11, wherein the clock generator comprises:
   a control clock generator generating the first control signal and outputting the first control signal to the switching unit; and
   a delay unit outputting the second control signal, generated by delaying the first control signal by the phase difference, to the sampling unit.

13. The random number generator of claim 1, wherein the clock generator comprises:
   a control clock generator generating the first control signal; and
   a sampling clock generator generating the second control signal.

14. The random number generator of claim 1, wherein the sampling unit comprises a flip-flop.

15. The random number generator of claim 4, wherein the inverting elements have physical noise.

16. The random number generator of claim 1, wherein the RO block comprises:
   a switching unit operating in response to the first control signal;
   a delay unit delaying an output signal of the RO block and outputting the delayed output signal to one input end of the switching unit;
   an inverter unit receiving an output signal of the switching unit; and
   a meta stable voltage offering unit outputting the meta stable voltage to another input end of the switching unit.

17. The random number generator of claim 1, wherein the RO block comprises:
   a variable delay unit varying a delay amount in response to the first control signal; and
   an inverting element connected in series with an output end of the variable delay unit and including an odd number of inverting elements performing the RO operation;
   wherein an output end of the inverting elements and an input end of the variable delay unit are connected via a feedback path.

18. The random number generator of claim 17, wherein when each delay amount of the variable delay unit, the inverting element, and the feedback path is a variable delay amount, an inverting delay amount, and a resistive/capacitive (RC) delay amount, respectively, and
   wherein the variable delay unit controls the delay amount in response to one of the logic levels of the first control signal so that a sum of the variable delay amount and the inverting delay amount is smaller than the RC delay amount.

19. The random number generator of claim 18, wherein the variable delay unit controls the delay amount in response to another one of the logic levels of the first control signal so that the sum of the variable delay amount and the inverting delay amount is larger than the RC delay amount.

20. The random number generator of claim 19, wherein the inverting element is a NAND gate, NOR gate, or XNOR gate.

21. The random number generator of claim 1, wherein the sampling unit comprises a flip-flop, receives the second control signal into a clock input end of the flip-flop, and receives an output signal of the RO block into a data input end.

22. The random number generator of claim 5, wherein an output of each of the switching units is input to the sampling unit.

* * * * *